United States Patent
Rosen et al.

(10) Patent No.: US 6,573,800 B2
(45) Date of Patent: Jun. 3, 2003

(54) CONTINUOUSLY CHANGING RANDOM SIGNAL GENERATING ARRANGEMENT AND METHOD

(75) Inventors: Marvin E. Rosen, Cranford, NJ (US); Vladimir Odessky, Hamilton Township, NJ (US); Michael J. Lubas, Basking Ridge, NJ (US); David Atwell, Gales Ferry, CT (US)

(73) Assignee: Electric Boat Corporation, Groton, CT (US)

( * ) Notice: Subject to any disclaimer, the term of this patent is extended or adjusted under 35 U.S.C. 154(b) by 9 days.

(21) Appl. No.: 09/883,053

(22) Filed: Jun. 15, 2001

(65) Prior Publication Data

US 2002/0190800 A1 Dec. 19, 2002

(51) Int. Cl.⁷ .............................................. H03B 29/00
(52) U.S. Cl. ............................ 331/78; 331/50; 708/250
(58) Field of Search .............................. 331/78, 47, 48, 331/50; 708/250, 251, 255

(56) References Cited

U.S. PATENT DOCUMENTS

| | | |
|---|---|---|
| 2,833,925 A | 5/1958 | Lappe |
| 3,384,834 A | 5/1968 | Treadwell |
| 3,427,478 A | 2/1969 | Etter |
| 3,671,828 A | 6/1972 | Geffken |
| 3,810,039 A | 5/1974 | Fein |
| 3,909,734 A | 9/1975 | Palombo et al. |
| 4,027,211 A | 5/1977 | Omura et al. |
| 4,107,683 A | 8/1978 | Neri et al. |
| 4,318,008 A | 3/1982 | Nall |
| 4,588,934 A | 5/1986 | Suzuki et al. |
| 4,825,132 A | 4/1989 | Gritter |
| 4,855,690 A | 8/1989 | Dias |
| 4,916,411 A | 4/1990 | Lymer |
| 5,245,660 A | 9/1993 | Pecora et al. |
| 5,379,346 A | 1/1995 | Pecora et al. |
| 6,107,776 A | 8/2000 | Nakazawa |

*Primary Examiner*—Robert Pascal
*Assistant Examiner*—Kimberly E Glenn

(57) ABSTRACT

In the particular embodiments of the invention described in the specification, a first signal generator produces a signal which changes in cycles having approximately straight line segments between maximum and minimum values at a first rate and a second signal generator produces a signal which changes in cycles having approximately straight line segments at a second rate which is an order of magnitude greater than the first rate. The maximum level of the second signal during any cycle is dependent upon the instantaneous signal level of the first signal and the minimum level of the second signal during any cycle is dependent upon a selected fraction of the instantaneous signal level of the first signal. The second signal is used to control the speed of a motor in a continuously changing random manner.

15 Claims, 3 Drawing Sheets

CONTINUOUSLY CHANGING RANDOM SIGNAL GENERATING ARRANGEMENT AND METHOD

BACKGROUND OF THE INVENTION

This invention relates to methods and arrangements for generating continuously changing random signals.

In many cases it is important to be able to generate a non-repetitive random reference signal for controlling certain events such as the speed of rotation of a machine of the type used for lapping the surfaces of balls for ball bearings or for altering the harmonic spectrum signature of a motor or a group of motors. In conventional systems a variable reference signal is generated in which the variation can be adjusted or selected manually from a rotary control or key pad.

The Fein U.S. Pat. No. 3,810,039 discloses a random signal generator containing first and second oscillators operating at two different frequencies in which the first oscillator output is sampled at the frequency of the second oscillator so that the output signal changes frequency from the first frequency to the second frequency periodically.

The Treadwell U.S. Pat. No. 3,384,834 discloses a frequency synthesizer containing two oscillators having different cyclic frequencies with the second oscillator output having upper and lower excursion limits which are determined by the first oscillator output. In the Dias U.S. Pat. No. 4,855,690 a random number generator has a first oscillator which varies the frequency of the output of a second, higher frequency oscillator. The Patent to Neri U.S. Pat. No. 4,107,683 discloses a motor controller circuit for controlling revolution of an antenna illuminator utilizing a reference signal generator and a digital random generator.

These prior art arrangements and methods are complex and expensive and do not provide the advantages of the present invention.

SUMMARY OF THE INVENTION

Accordingly it is an object of the present invention to provide a method and arrangement for generating continuously changing random signals which overcomes disadvantages of the prior art.

Another object of the invention is to provide a method and arrangement for generating continuously changing random signals in a simple and convenient manner.

These and other objects of the invention are attained by providing a random signal generating arrangement having two series-connected signal generators, the first signal generator producing a first signal having a signal level which changes in cycles between a maximum and minimum values at a first rate and the second signal generator producing a second signal which changes in cycles between maximum and minimum values at a substantially greater rate, in which the maximum level of the second signal in any cycle is determined by the instantaneous level of the first signal. Preferably, the minimum level of the second signal during any cycle is related to a selected fraction of the instantaneous level of the first signal. In a typical embodiment, the first and second signal generators have substantially the same circuit arrangement except for the size of capacitors that control the rate of change of the signal level of the output signal. Since the first signal is provided as an input to the second signal generator, the maximum and minimum values of the second signal follow a pattern which is determined by the continuously changing value of the first signal.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENT

Figure 1:
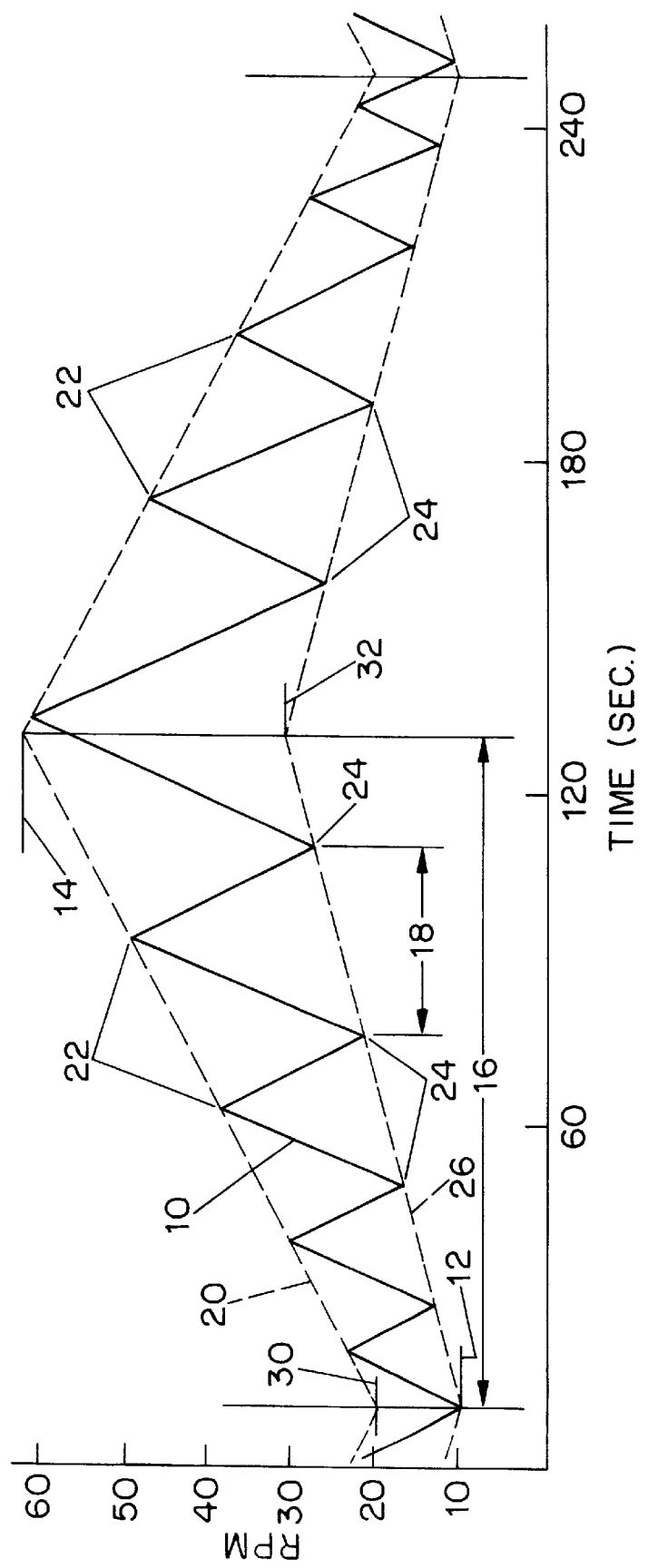
FIG. 1 is a graphical illustration showing the change in signal level with time of a representative continuously changing random signal generated in accordance with the invention.

The change in signal level with time of a typical example of a continuously changing random signal generated in accordance with the invention is represented by a line 10 illustrated in FIG. 1. In this example the signal 10 may be a control signal, such as a motor speed control signal, which has a level that continuously changes to control a motor rotation speed and which varies in a continuously changing manner between a minimum speed level 12 of, for example, 10 rpm and a maximum speed level 14 of, for example, 60 rpm during a half cycle 16 which has a period of about 2 minutes.

During each half cycle 16 the instantaneous level of the signal 10 varies in a cyclic manner with a cycle period 18 which varies between an upper limit 20 determined by the instantaneous level of a cyclical upper threshold signal 22 and a lower limit 24 determined by the instantaneous level of a lower threshold signal 26 which is a selected fraction of the level of the upper threshold signal 22. As shown in FIG. 1, the cyclical period of the threshold signal 22 is substantially longer than that of the signal 10, preferably between about five and twenty-five times as long, and desirably about an order of magnitude longer. In the illustrated example, the selected fraction of the upper threshold signal 22 which determines the instantaneous level of the lower threshold signal 26 is about one half.

In the typical continuously changing random signal 10 depicted in FIG. 1, the rising and falling slopes of the signal during each cycle are approximately the same. Consequently, since the upper and lower threshold signals 22 and 26 change at different rates, the period of the cycle 18 also increases and decreases during each period of the threshold signal 22 as shown in FIG. 1. For example, the period 18 may be about 20 seconds near the minimum level of the signal 20 and about 40 seconds near the maximum level 14 of the signal 20. Accordingly, by appropriate selection of the lower and upper limits 12 and 14 of the threshold signal 20, the variation in operating speed of a motor or in periodic occurrences of another event controlled by the continually changing signal 10 can be selected so that it follows an essentially non-repetitive pattern with continuous random variation. For example, if the cycle times of the signals 10 and 22 and the minimum level 30 and maximum level 14 of the threshold signal are selected so that there are almost but not exactly ten cycles 18 of the signal 10 during each period of the threshold signal cycle, as in the illustrated example, there will be no repetition of the cyclic pattern of the signal 10 for several hundred or several thousand cycles.

For this purpose it is desirable to be able to adjust the upper limit level 14 and the lower limit level 30 of the upper threshold signal 22 and the corresponding upper and lower limit level 12 and 32 of the lower threshold signal 26, which will determine the number of cycles of the signal 18 during each cycle of the threshold signal 20. It will be understood that the shape of the signal 10 may have any desired form, for example, generally straight line rising and falling segments or sinusoidal or any intermediate shape. For example, the signal 10 may be curved in one direction when rising to a maximum level 22 and curved in the opposite direction when falling to a minimum level 24 and the threshold signals 20 and 26 may be similarly shaped according to the charging and discharging characteristics of one or more capacitors in the signal generating circuits used to produce the signal 10.

Figure 2:
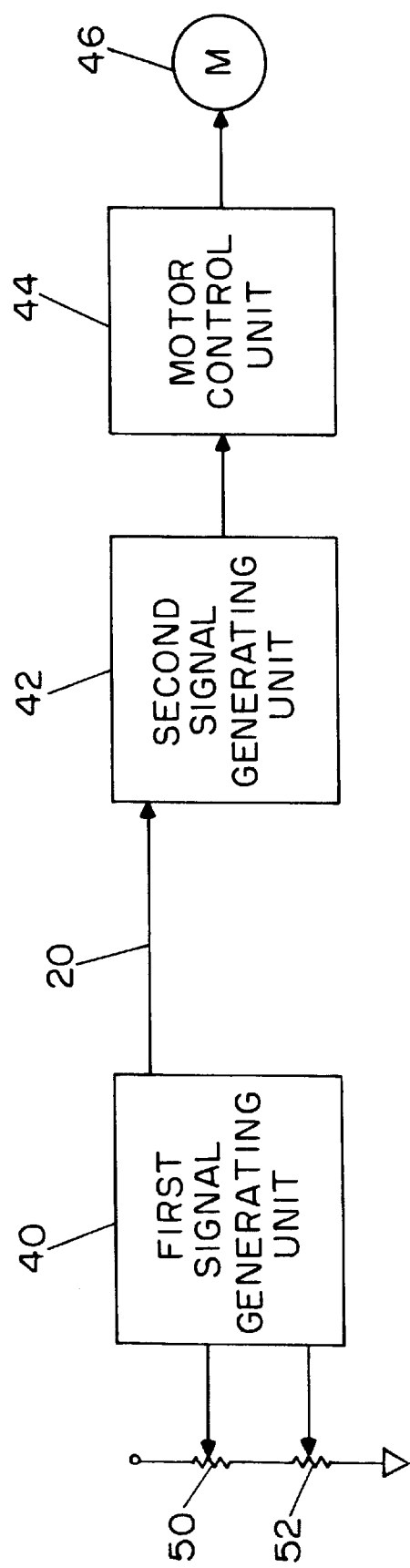
FIG. 2 is a schematic block diagram showing a representative arrangement for generating a signal of the type shown in FIG. 1.

FIG. 2 is a schematic block diagram illustrating a representative arrangement for producing continuously changing random signals of the type shown in FIG. 1 and providing for adjustment of the maximum and minimum levels 12 and 14 of the upper threshold signal 20. In the typical arrangement shown in FIG. 2, a first signal generating unit 40 produces the threshold signal 20 having a long half cycle time 16 and a second signal generating unit 42 produces the signal 10 having a shorter cycle time 18 and in which the maximum signal level is limited by the instantaneous level of the upper threshold signal 22 received from the first signal generating unit 40 and the minimum level of the signal 10 is limited by the instantaneous signal level of the lower threshold signal which is a selected fraction such as, for example 50%, of the instantaneous level of the upper threshold of the signal 22. The output signal 10 from the second signal generating unit 42 is supplied to a motor control unit 44, for example for controlling the speed of a motor 46.

In this arrangement the maximum and minimum levels 14 and 30 of the upper threshold signal 20 from the first signal generating unit 40 can be controlled by adjustment of variable resistances 50 and 52 associated with the first signal generating unit while the maximum and minimum levels 32 and 12 of the lower threshold signal 26 are determined by a ratio circuit within the second signal generating unit 42.

Figure 3:
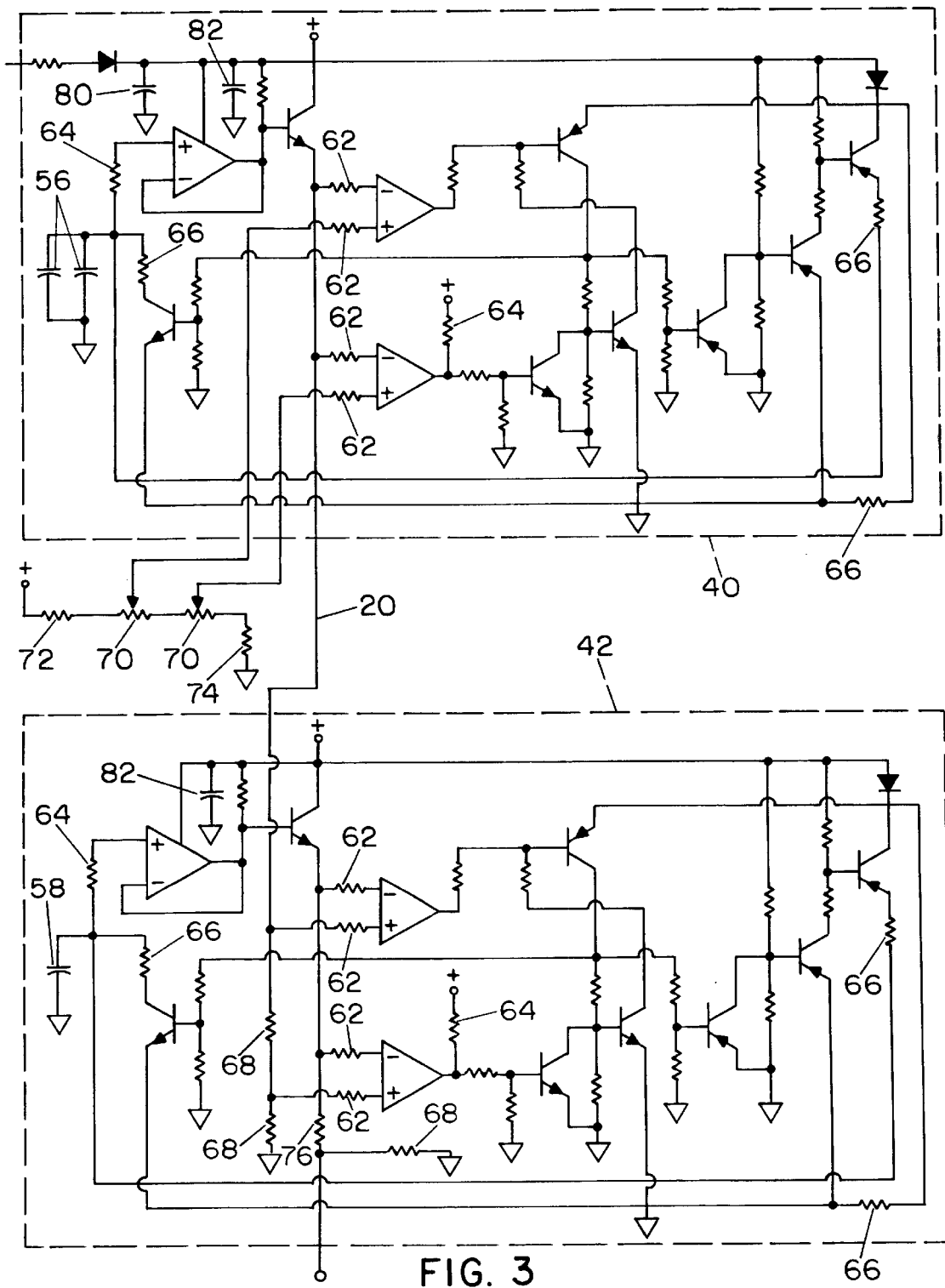
FIG. 3 is a schematic circuit diagram showing a representative arrangement of circuit components for use in the signal generator shown in FIG. 2.

FIG. 3 is a schematic circuit diagram illustrating a representative circuit arrangement for the signal generating units 40 and 42 shown in FIG. 2. In this example, the circuits for the two units are substantially identical and are designed to produce an output signal 10 having a shape with substantially straight line rising and falling segments as shown in FIG. 1. The only difference between the circuits 40 and 42 is in the values of the capacitors 56 and 58 which control the slope of the signals 20 and 10, respectively, and in the presence of resistors 68 in the circuit 42 which determine the fraction of the lower threshold signal level to the upper threshold signal level.

In a particular embodiment of the circuits shown in FIG. 3 all of the resistors 62 are 360 K ohm resistors, the resistors 64 are 13 K ohm resistors, the resistors 66 are 24 K ohm resistors, the resistors 68 are 12 K ohm resistors, the resistors 70 are 10 K ohm resistors, the resistor 72 is an 8.2 K ohm resistor, the resistor 74 is a 2.2 K ohm resistor and the resistor 76 is a 5.6 K ohm resistor while all of the other resistors have a value of 43 K ohms. Moreover, the capacitors 56 have a value of 10,000 microfarads and the capacitor 58 has a value of 2,200 microfarads, while the capacitor 80 has a value of 47 microfarads and the capacitors 82 have a value of 0.1 microfarad.

With this arrangement, the continuously changing random reference signal 10 is produced in a simple and inexpensive way, enabling the system to provide a control signal for controlling an event in a continuously changing random manner. In a representative application as shown in FIG. 1, the system controls the speed of the motor 46 is varied in a continuously changing random cyclical manner between about 10 rpm and about 60 rpm.

Although the invention has been described herein with reference to specific embodiments, many modifications and variations therein will readily occur to those skilled in the art. Accordingly, all such variations and modifications are included within the intended scope of the invention.

We claim:

1. A random signal generating arrangement comprising:
   a first signal generator generating a first signal having a signal level which changes in cycles between maximum and minimum values at a first rate; and
   a second signal generator receiving an output of the first signal generator and generating a second signal having a signal level which changes in cycles between maximum and minimum values at a second rate which is substantially greater than the first rate and which has a maximum signal level during any cycle that is dependent upon the instantaneous signal level of the first signal.

2. A random signal generating arrangement according to claim 1 wherein the second rate is between about five and about twenty-five times the first rate.

3. A random signal generating arrangement according to claim 1 wherein the second rate is approximately an order of magnitude greater than the first rate.

4. A random signal generating arrangement according to claim 1 wherein the level of the first signal changes between maximum and minimum values in approximately straight lines.

5. A random signal generating arrangement according to claim 1 wherein the minimum signal level of the second signal during any cycle is a selected fraction of the instantaneous signal level of the first signal.

6. A random signal generating arrangement according to claim 5 including a ratio circuit for determining the selected fraction.

7. A random signal generating arrangement according to claim 1 wherein the first signal generator comprises a circuit having a first selected capacitance for controlling the rate of change of the level of the first signal and the second signal generator comprises a circuit having a second selected capacitance which is smaller than the first capacitance for controlling the rate of change of the level of the second signal.

8. A random signal generating arrangement according to claim 1 wherein the first signal generator comprises a variable resistance for controlling the maximum signal level of the first signal.

9. A random signal generating arrangement according to claim 1 wherein the first signal generator comprises a variable resistance for controlling the minimum signal level of the first signal.

10. A random signal generating arrangement according to claim 1 including a motor control unit for controlling the speed of a motor in accordance with the level of the second signal.

11. A method for generating a continuously changing random signal comprising:
   generating a first signal having a level which changes in cycles between maximum and minimum values at a first rate; and
   generating a second signal having a level which changes in cycles between maximum and minimum values at a second rate which is higher than the first rate and which has a maximum signal level in any cycle that is dependent on the instantaneous signal level of the first signal.

12. A method according to claim 11 wherein the second rate is from about five times to about twenty five times the first rate.

13. A method according to claim 12 wherein the second rate is approximately one order of magnitude greater than the first rate.

14. A method according to claim 11 including controlling the minimum level of the second signal during any cycle in accordance with a value which is a selected fraction of the instantaneous signal level of the first signal.

15. A method according to claim 11 including controlling the speed of operation of a motor in accordance with the level of the second signal.

* * * * *